United States Patent [19]
Jensen et al.

[11] Patent Number: 5,711,860
[45] Date of Patent: Jan. 27, 1998

[54] METHOD AND APPARATUS FOR PRODUCING A SUBSTRATE WITH LOW SECONDARY ELECTRON EMISSIONS

[75] Inventors: Kenneth A. Jensen, Bay Village; Arthur N. Curren, North Ridgeville; Robert F. Roman, Brook Park, all of Ohio

[73] Assignee: The United States of America as represented by the Administrator of the National Aeronautics and Space Administration, Washington, D.C.

[21] Appl. No.: 591,125

[22] Filed: Jan. 25, 1996

Related U.S. Application Data

[63] Continuation of Ser. No. 331,392, Oct. 26, 1994, abandoned.

[51] Int. Cl.$^6$ ................................................. C23C 14/34
[52] U.S. Cl. ................... 204/192.11; 204/192.3; 204/192.32; 204/192.35; 204/192.15; 204/192.34
[58] Field of Search .................... 204/192.11, 192.12, 204/192.15, 192.3, 192.32, 192.35, 298.18, 298.04, 192.34; 427/523, 524, 528, 531

[56] References Cited

U.S. PATENT DOCUMENTS

| | | | |
|---|---|---|---|
| 3,604,970 | 9/1971 | Culbertson, et al. | 313/107 |
| 4,349,424 | 9/1982 | Sovey, et al. | 204/192 |
| 4,411,733 | 10/1983 | Macklin et al. | 204/192.11 |
| 4,417,175 | 11/1983 | Curren, et al. | 315/5.38 |
| 4,607,193 | 8/1986 | Curren et al. | 204/192.15 |
| 4,692,230 | 9/1987 | Nihei et al. | 204/192.11 |
| 4,693,760 | 9/1987 | Sioshansi | 148/4 |
| 4,885,070 | 12/1989 | Campbell et al. | 204/192.11 |
| 4,999,096 | 3/1991 | Nihei et al. | 204/192.15 |
| 5,245,248 | 9/1993 | Chan et al. | 313/309 |

OTHER PUBLICATIONS

"An Effective Secondary Electron Emission Suppression Treatment for Copper MDC Electrodes" Curren et al., International Electron Devices Meeting, Washington, DC., Dec. 5–8, 1993 pp. 31.8.1–31.8.3.
International Electron Devices Meeting Washington, DC, Dec. 5–8, 1993.

*Primary Examiner*—R. Bruce Breneman
*Assistant Examiner*—Rodney G. McDonald
*Attorney, Agent, or Firm*—Kent N. Stone; Susan Reinecke

[57] ABSTRACT

The present invention is directed to a method and apparatus for producing a highly-textured surface on a copper substrate with only extremely small amounts of texture-inducing seeding or masking material. The texture-inducing seeding material is delivered to the copper substrate electrically switching the seeding material in and out of a circuit loop.

14 Claims, 3 Drawing Sheets

METHOD AND APPARATUS FOR PRODUCING A SUBSTRATE WITH LOW SECONDARY ELECTRON EMISSIONS

This is a continuation of application Ser. No. 08/331,392 filed on Oct. 26, 1994, now abandoned.

ORIGIN OF THE INVENTION

The invention described herein was made by employees of the United States Government and may be manufactured and used for the Government for government purposes without the payment of any royalties thereon or therefore.

FIELD OF THE INVENTION

The present invention is directed to a method and apparatus for producing a highly-textured surface on a copper substrate with only extremely small amounts of texture-inducing seeding or masking material. The purpose of the invention is to produce a surface with secondary electron emission properties sharply lower than those of untreated copper.

The present invention is particularly useful on surfaces of multistaged depressed collector electrodes of vacuum-tube amplifiers such as traveling-wave tubes or klystrons. These devices, which are widely used in space communications, aircraft, and terrestrial applications, are described in U.S. Pat. No. 3,702,951 to H. Kosmahl.

Some of the significant factors involved in maximizing the efficiency of these devices include the use of electrode materials that have low secondary electron emission properties. This is discussed in U.S. Pat. No. 4,349,424 to Sovey et al. Specifically, these low secondary electron emission properties recover the maximum kinetic energy from the spent electron beam after it has passed through the device's interaction section and entered the collector. To have high collector efficiency, the electrodes must have low secondary electron emission characteristics so that the impinging electrons are not excessively reflected or re-emitted from the surfaces. Textured copper surfaces have been found to be useful for this purpose. Untreated copper surfaces have relatively high secondary electron emission levels.

Prior art methods for achieving copper surfaces with reduced secondary electron emission properties included coating the surfaces with compounds such as titanium carbide or roughening the surface by various means such as particle blasting. However, these prior art methods produce only modest reductions in secondary electron emission properties. Specifically, the coating approach results in a coating/substrate interface which becomes subject to delamination failure with vibration or repeated thermal cycling due to the difference in thermal expansion characteristics between the coating and the substrate. The particle-blasting approach is generally even less effective and poses the potential problem of leaving residual and loosely-attached particles of the abrasive material on the substrate, which may cause damage by separating from the substrate during operation and migrating to other components.

Additional methods such as the direct and continuous simultaneous ion-bombardment of stainless steel, tantalum, or molybdenum targets and copper substrates in a low-pressure environment also produce a highly-textured copper surface which displays low secondary electron emission properties. While the secondary electron emission properties of the copper substrate are sharply reduced by the use of this method, the resulting surface generally is burdened with unacceptably large amounts of residual target material which poses the potential problem of separating from the substrate in operation by virtue of large differences in thermal expansion properties with the copper substrate.

It is therefore an object of the invention to produce an ion-textured copper substrate with very low secondary electron emission properties with only acceptably small (essentially trace) amounts of residual target material which pose no potential problem of separation from the substrate by virtue of thermal expansion differences.

It is a further object of the present invention to use electrical means to turn the bombardment of the substrate with the target material off and on to control and minimize the deposition or arrival rate of the target material on the substrate.

DESCRIPTION OF RELATED ART

U.S. Pat. No. 3,604,970 to Culbertson discloses an electrode which has been coated with a non-emissive coating produced through ion implantation. U.S. Pat. No. 4,349,424 to Sovey relates to a sputtering process which is intended to reduce secondary emissions. U.S. Pat. No. 4,417,175 to Curren discloses a sputtering process which reduces secondary emissions in which a resurfaced graphite plate is used. U.S. Pat. No. 4,607,193 to Curren discloses a triode sputtering process to apply a textured carbon coating onto a copper substrate. U.S. Pat. No. 4,693,760 to Sioshansi relates to a coating process in which ion sputtering of a titanium surface is intentionally carried out to produce a surface with a high porosity. U.S. Pat. No. 5,245,248 to Chan illustrates the geometry of an emitter.

SUMMARY OF THE INVENTION

The present invention discloses a method of developing a secondary-electron-suppressing highly textured copper surface with small, acceptable amounts of residual molybdenum texture-inducing masking material. This is accomplished by controlling the arrival rate of a molybdenum target/seeding material at the copper surface.

BRIEF DESCRIPTION OF THE DRAWINGS

The objects, advantages, and novel features of the invention will be more fully apparent from the following detailed description when read in connection with the accompanying drawings in which.

DESCRIPTION OF THE PREFERRED EMBODIMENT

Figure 1:
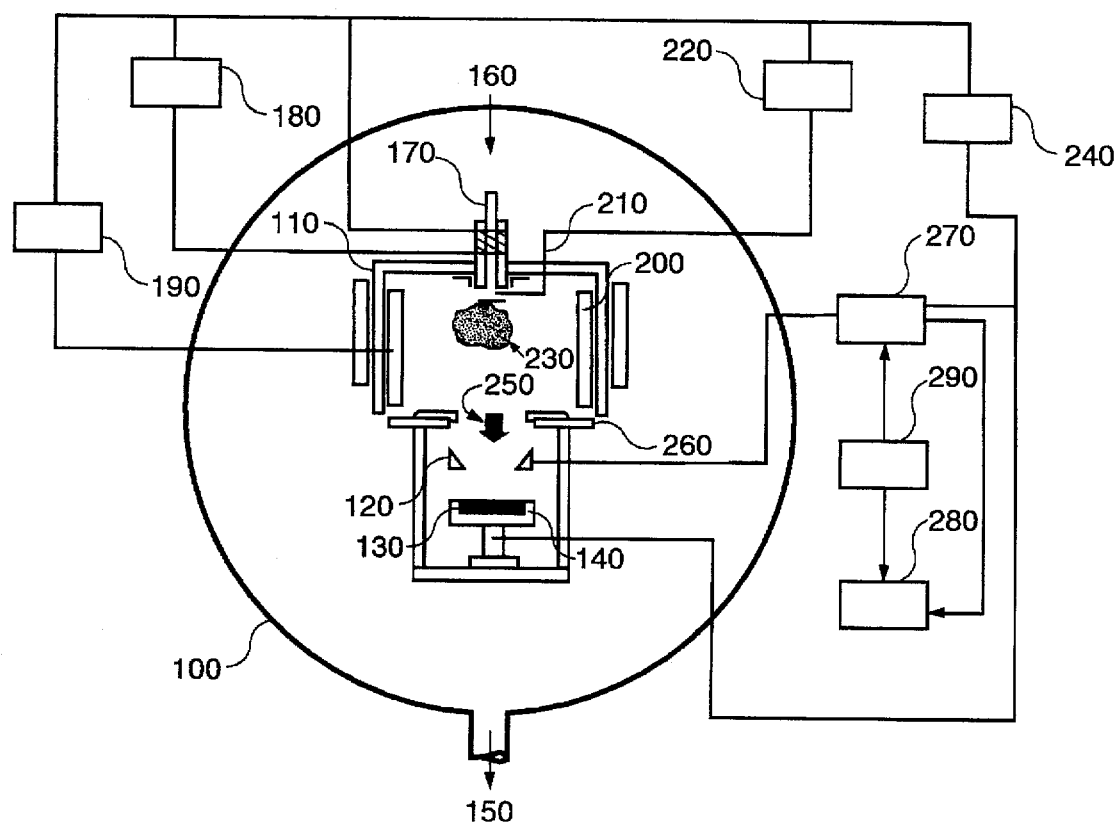
FIG. 1. displays a schematic diagram of the ion-texturing apparatus.
Figure 2:
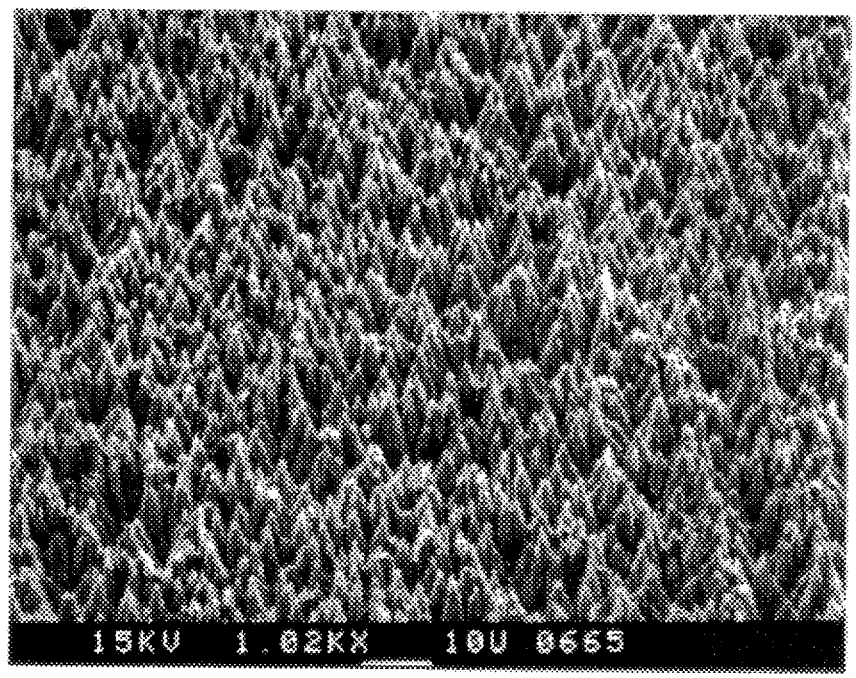
FIG. 2. displays a scanning electron microscope photomicrograph of an ion-textured oxygen-free, high-conductivity (OFHC) copper surface.

FIG. 1 displays a schematic diagram of the facility developed to accomplish the ion-texturing of copper as shown in FIG. 2.

In FIG. 1 the textured copper surface is formed by means of a triode sputtering process, in which a copper substrate is continuously exposed to an accelerated argon plasma beam in a low-pressure environment while a molybdenum target/seeding element is simultaneously but intermittently exposed to the same plasma beam.

FIG. 1 displays a schematic diagram of the ion-texturing apparatus contained within a vacuum chamber 100. The vacuum chamber 100 contains a plasma chamber 110, along with an annular molybdenum target 120 and a copper substrate 130 mounted on a copper support structure 140, all positioned as shown.

Prior to starting the texturing process, the vacuum chamber 100 is evacuated to and maintained at a pressure of from $1 \times 10^{-4}$ to $4 \times 10^{-4}$ torr (millimeters of mercury) by means of a pumping system 150. When the reduced-pressure condition within the vacuum chamber 100 is reached, argon gas 160 is ducted into the plasma chamber 110 through a resistance-heated hollow cathode 170, the heater of which is served by a cathode heater power supply 180. At the same time, an anode power supply 190 establishes a potential difference between the cathode 170 and the plasma chamber anode 200, and an arc rf starter 210 served by a starter power supply 220 is momentarily activated to establish a quiescent plasma 230 within the plasma chamber 110.

The texturing process begins when a potential difference is established between the cathode 170 and both the molybdenum target 120 and copper substrate 130 by means of a high-voltage power supply 240. This potential difference causes an ion beam 250 to be directed through a restricting electrically-floating orifice plate 260 and simultaneously impinge the molybdenum target 120 and copper substrate 130. The ion beam 250 removes small quantities of material from the molybdenum target 120 and deposits it in a discontinuous but uniform "mask" over the surface of the copper substrate 130. Formation of the textured surface on the copper substrate 130 apparently comes about as the result of the differences in sputtering properties between molybdenum and copper, with the copper being sputtered away by the ion beam far more rapidly than the molybdenum dispersed masking to form densely-packed, uniform, and sharply-defined conical copper spires. During the texturing process, the ion beam 250 continuously impinges the copper substrate 130 as a result of the potential difference between the cathode 170 and the copper substrate 130. A high-speed switch module 270 controls the potential difference between the copper substrate 130 and the molybdenum target 120. When the switch module 270 provides for the molybdenum target 120 and the copper substrate 130 to be at the same potential relative to the cathode 170, the ion beam 250 deposits material from the molybdenum target 120 to the copper substrate 130. When the switch module 270 electrically disconnects the molybdenum target 120 from the copper substrate 130 (except for a small sustaining current), the deposition of material from the molybdenum target 120 to the copper substrate 130 is sharply reduced or eliminated. By regulating the switch module 270, the arrival rate of material from the molybdenum target 120 to the copper substrate 130 is controlled. An oscillator switch control 290 regulates the switch module 270 and establishes the switching frequency as well as the duty cycle, or that portion of each switching cycle during which the molybdenum target 120 and copper substrate 130 are electrically connected. Hence, a switching frequency of 20 Hz with a duty cycle of 25 percent indicates the molybdenum target 120 and the copper substrate 130 are electrically connected 25 percent of the time (0.0125 second) during each of twenty switching cycles (0.05 second each) which occur during one second. The output signals of the oscillator switch control 290 and switch module 270 are monitored with the use of a duty cycle monitor 280. During processing, a pre-selected current level is established between the cathode 170 and the copper substrate 130. During the period when the molybdenum target 120 is electrically disconnected from the copper substrate 130 by the switch module 270, the entire pre-selected current (except for a small sustaining current) passes through the copper substrate 130 and its copper support structure 140. During the period when the switch module 270 electrically connects the molybdenum target 120 and the copper substrate 130, the pre-selected current flow is divided between the molybdenum target 120 and the copper substrate 130.

In a typical case, where the copper substrate 130 is circular in shape, the molybdenum target 120 is annular, approximately the same diameter as the copper substrate 130 with the target surface facing the ion beam 250 sloping radially upward at an angle of approximately 45 degrees, and spaced approximately one-half the diameter of the copper substrate 130 from the copper substrate 130. This configuration has been shown to provide for uniform development of the textured surface of the copper substrate 130.

Figure 3:
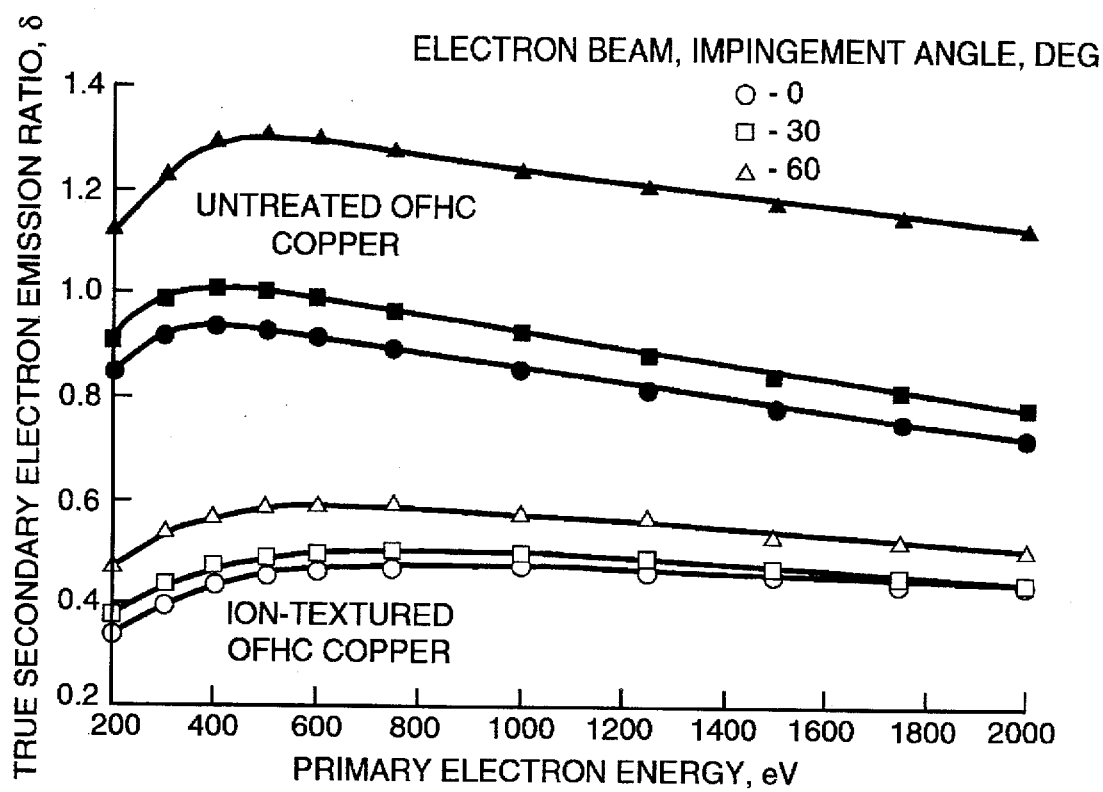
FIG. 3. displays a graph of the true secondary electron emission ratio as a function of primary electron energy.
Figure 4:
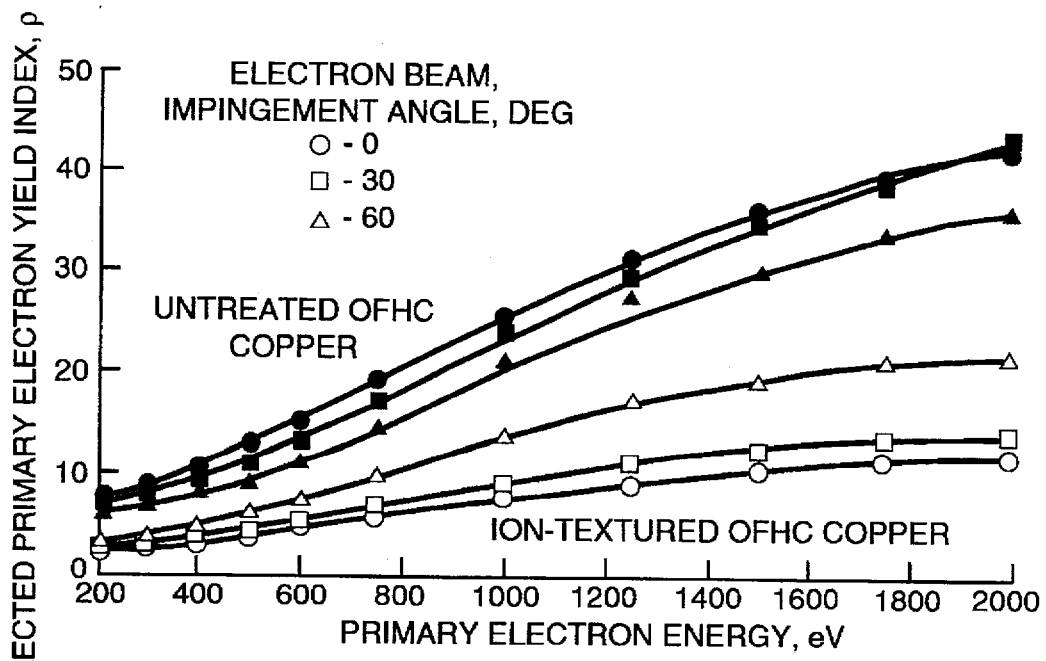
FIG. 4. displays a graph of the reflected primary electron yield index as a function of primary electron energy.

The operating conditions which were used to produce the textured copper surface displayed in FIG. 2 and whose secondary electron emission characteristics are displayed in FIGS. 3 and 4 are as follows:

Vacuum chamber pressure: $1 \times 10^{-4}$ to $4 \times 10^{-4}$ torr (millimeters of mercury)

Ionizing gas: argon

Accelerating potential difference: 1500 volts dc

Substrate current density (approx.): 5 mA/cm$^2$

Texturing period: 1 hour

Switching frequency: 20 Hz

Duty cycle: 25 percent

FIG. 2 is a scanning electron microscope photomicrograph of an ion-textured copper surface produced by the process described in this disclosure, taken at an angle of 30 degrees from normal to the surface. The morphology is characterized by a dense uniform array of pointed spires normal to the surface with average feature height and separation of approximately 10 and 5 micrometers, respectively. Examinations of this surface by Auger and energy-dispersive X-ray analyses indicate the presence of only extremely small amounts of the texture-inducing seeding or masking material, molybdenum.

The textured copper surface characteristics and consequently the secondary electron emission characteristics may be altered from those of the surface described in this disclosure by varying the operating conditions within reasonable limits. It will be appreciated that other gases in addition to argon can be used to form the bombarding ions in the ion beam. For example, xenon may also be used.

The secondary electron emission characteristics for normal beam impingement and 30 and 60 degrees from normal beam impingement for a representative primary electron beam energy range for the surface produced in accordance with the present invention are shown in FIGS. 3 and 4. The true secondary electron emission ratio, which is the ratio of low energy emitted electrons to impinging electrons for the conditions described, is shown by the curves in FIG. 3. The reflected primary electron yield indexed to that of a sooted control surface at the same primary beam energy and beam impingement angle, is shown by the curves in FIG. 4. The measurements were made using a method described in "Secondary Electron Emission Characteristics of Molybdenum-Masked Ion-Textured OFHC Copper", NASA TP-2967, 1990, by Curren, A. N., Jensen, K. A., and Roman, R. F.

For comparison, characteristics curves for untreated copper are also shown in FIGS. 3 and 4, respectively. The sharply lower emission level for the surface of the present invention relative to those of the untreated copper are clearly evident. The true secondary electron emission ratio increases with beam impingement angle over the entire energy range for both the untreated and ion-textured copper surfaces, with the values for ion-textured copper ranging from 40 to 60 percent lower than those for untreated copper, as shown in FIG. 3. FIG. 4 indicates the reflected primary electron yield index for the textured copper is significantly lower than that for untreated copper for all beam impingement angles across the entire energy range, ranging from a minimum of about 30 percent at 60 degrees beam impingement angle to about 70 percent at 0 degrees beam impingement angle.

Most of the electrons in a primary electron beam which impinges the textured copper surface strike the conical sloping walls of the spires or at the base of the spires. Secondary electrons which are then emitted from these regions are repeatedly intercepted with repeated partial retention by nearby adjacent spire walls. This greatly reduces net electron emission from the textured surface. The highly textured surface therefore is the principal factor in producing the low secondary electron emission characteristics exhibited by the surface of the present invention relative to those of untreated copper.

While the preferred embodiment of the invention is disclosed and described it will be apparent that various modifications may be made without departing from the spirit of the invention or the scope of the subjoined claims.

What is claimed:

1. A method of producing a textured surface in an ion texturing apparatus, said apparatus comprising a plasma chamber, an anode, a cathode, a copper support, a first power supply connecting said anode to said cathode, a second power supply connecting said cathode to said copper support, a switch module connecting to said copper support, and a floating plate, said method comprising the steps of:

placing a substrate on said copper support, positioning a target material above said substrate, connecting said target material to said switch module, evacuating air from said plasma chamber thereby creating a vacuum environment with a vacuum chamber pressure, introducing argon gas including ions therein, into said plasma chamber, producing an ion-beam in said plasma chamber by utilizing a negative potential difference across said target and said substrate to attract said ions in said argon gas, simultaneously directing said ion-beam through said target material onto said substrate by using said floating plate to restrict said ion-beam and, growing spires on said substrate by intermittently depositing said target material on said substrate by utilizing said switch module to intermittently apply and remove a potential difference across said target material while maintaining said potential difference across said substrate, thereby producing a textured surface.

2. A method of producing a textured surface on a material, comprising the steps of:

positioning said material in an evacuated chamber, wherein said evacuated chamber has a pressure of approximately $1 \times 10^{-4}$ to approximately $4 \times 10^{-4}$ torr, applying a discontinuous mask to at least one surface of said material by intermittently applying a target material to the surface of said material, wherein said discontinuous mask is comprised of said target material, and wherein said target material has a lower sputtering rate than said material, and during said application of said discontinuous mask, simultaneously sputtering the surface containing said discontinuous mask to form spires in the surface, thereby producing said textured surface in said material.

3. A method as described in claim 2 wherein the surface containing said discontinuous mask is sputtered by an ion beam.

4. A method of producing a textured surface on a material, comprising the steps of:

positioning said material in an evacuated chamber, wherein said chamber contains a target material and a cathode, ducting gas into said chamber, applying a potential difference between said cathode and both said target and said material, to form an ion-beam that simultaneously sputters said target material onto said material to form a mask and sputters the surface of said material, whereby the sputtering of the surface of said material forms spires in said material, and switching said potential difference between said cathode and said target material on and off, thereby starting and stopping the sputtering of said target material onto said material, thereby controlling the deposition of said mask onto said surface so that said spires are formed in said material.

5. A method as described in claim 4 wherein the gas is argon.

6. A method as described in claim 5 wherein the material is copper.

7. A method as described in claim 6 wherein the target material is molybdenum.

8. A method as described in claim 7 wherein said target material is annular in shape.

9. A method as described in claim 8 wherein said material is circular in shape.

10. A method as described in claim 9 wherein said target material has the same diameter as said material, wherein the surface of said target material facing said ion beam slopes up at a 45 degree angle, and is spaced a distance of ½ the diameter of said material away from said material.

11. A method of producing a textured surface on a copper substrate, comprising the steps of:

positioning said substrate in an evacuated chamber, wherein said chamber contains a molybdenum target and a cathode, ducting argon gas into said chamber, applying a potential difference of 1500 volts dc between said cathode and both said target and said material, to form an ion-beam that simultaneously sputters said target onto said substrate to form a mask, and sputters the surface of said substrate, whereby the sputtering of the substrate forms spires in said material, and switching said potential difference between said cathode and said target material on and off at a frequency of 20 Hz and a duty cycle of 25 percent for a time period of approximately one hour, thereby starting and stopping the sputtering of said target material onto said material, thereby controlling the deposition of said mask onto said surface so that said spires are formed in said substrate.

12. A method as described in claim 11 wherein said target material is annular in shape.

13. A method as described in claim 12 wherein said material is circular in shape.

14. A method as described in claim 13 wherein said target material has the same diameter as said material, wherein the surface of said target material facing said ion beam slopes up at a 45 degree angle, and is spaced a distance of ½ the diameter of said material away from said material.

* * * * *